United States Patent [19]

Miyagaki et al.

[11] Patent Number: 5,094,978
[45] Date of Patent: Mar. 10, 1992

[54] METHOD OF PATTERNING A TRANSPARENT CONDUCTOR

[75] Inventors: Shinji Miyagaki, Tokyo; Seigen Ri, Yokohama, both of Japan

[73] Assignee: Fujitsu Limited, Kanagawa, Japan

[21] Appl. No.: 554,367

[22] Filed: Jul. 19, 1990

[30] Foreign Application Priority Data

Jul. 31, 1989 [JP] Japan ................... 1-198747

[51] Int. Cl.$^5$ .............................................. H01L 21/44
[52] U.S. Cl. ................................... 437/181; 437/228; 437/225; 156/650; 156/652; 156/643
[58] Field of Search ............... 437/181, 228, 225; 204/192.35; 156/643, 646, 667, 650, 651, 652

[56] References Cited

U.S. PATENT DOCUMENTS

| | | | |
|---|---|---|---|
| 3,979,240 | 9/1976 | Ghezzo | 156/667 |
| 4,093,504 | 6/1978 | Ponjee et al. | 156/667 |
| 4,336,295 | 6/1982 | Smith | 156/667 |
| 4,348,255 | 9/1982 | Schmidt | 156/667 |
| 4,544,444 | 10/1985 | Chang | 156/667 |
| 4,670,097 | 6/1987 | Abdalla et al. | 156/667 |
| 4,708,766 | 11/1987 | Hynecek | 156/643 |
| 4,750,980 | 6/1988 | Hynecek | 156/646 |
| 4,878,993 | 11/1989 | Rossi et al. | 204/192.35 |

Primary Examiner—Brian E. Hearn
Assistant Examiner—Tuan Nguyen
Attorney, Agent, or Firm—Staas & Halsey

[57] ABSTRACT

A method of forming a pattern of a transparent conducting film such as an indium tin oxide film, formed on the surface of a substrate including Si and being heated. A two-step etching method is employed, in which the transparent conducting film is wet-etched by an aqueous solution of a halogenide and thereafter an interfacial reacted layer generated at the interface of the transparent conducting film and substrate including Si is etched by a plasma etching method using a halogen.

10 Claims, 8 Drawing Sheets

FIG. I(d) PRIOR ART

FIG. I(e) PRIOR ART

METHOD OF PATTERNING A TRANSPARENT CONDUCTOR

BACKGROUND OF THE INVENTION

1. Field of the Invention

The present invention relates to a method of patterning a transparent conducting film and particularly to a method of patterning a transparent conducting film formed on a substrate including silicon.

For a light detecting part such as an imaging device, an amorphous silicon (a-Si) film suitable for receiving the visible light, an amorphous silicon carbide (a-SiC) film or a multilayered film thereof is of them are used and as a transparent conducting film, an indium (In).tin (Sn).oxide film (ITO film), for example. Therefore, processing of such a film is a very important fabrication process in the imaging device fabrication process.

2. Description of the Related Art

FIGS. 1(a)~(e) are schematic sectional views for explaining a part of the conventional fabrication process of an imaging device.

FIG. 1(a) shows a sample immediately before formation of a transparent conducting film, where a multilayered film consisting of a-SiC film/a-Si film/a-SiC film is formed as the light receiving part. The structures shown in FIGS. 1(a)~(e) are called the "sample" in the respective steps.)

In FIG. 1(a), the reference numeral 1 denotes a silicon substrate; 2, a silicon oxide film ($SiO_2$ film) for device separation; 3, an interlayer insulation film; 4, a transistor for amplification; 5, Al wiring; 6, a PSG (phosphosilicate glass) film for flattening; 7, a light receiving part consisting of an a-SiC film 7d/a-Si film 7c/a-SiC film 7b. In this FIGURE, a collector electrode for the charges generated through photoelectric conversion, a charge storage diode and a CCD (Charge Coupled Device) for transferring charges have the well known structure and these are not illustrated.

As shown in FIG. 1(b), a sample of FIG. 1(a) is put into a sputtering apparatus, substrate temperature is raised (up to about 150° C.) and thereafter a first transparent conducting film 8 consisting of ITO is formed by the sputtering on the a-SiC film 7d. Here the substrate is heated to improve adhesive strength between the substrate and the transparent conducting film and also to improve light receiving characteristics.

Next, as shown in FIG. 1(c), a resist pattern 9 is formed on the first transparent conducting film 8 and this first transparent conducting film 8 is then removed by etching using the aqueous solution of ferric chloride ($FeCl_3$) with the resist pattern 9 used as the mask. Such wet etching is carried out here because since the vapor pressure of indium (In) and tin (Sn) is low, and consequently an etching rate is low for the dry etching of ITO.

As shown in FIG. 1(d), after the a-SiC film 7d/a-Si film 7c/a-SiC film 7b is etched by nitrogen trifluoride ($NF_3$), the PSG film 6 on the Al wiring 5 is selectively etched and thereby an aperture 10 is formed. Thereafter, this sample is put into the sputtering apparatus and a second transparent conducting film 11 is formed on the sample surface under the same conditions as as existed during formation of the first transparent conducting film 8. Thereby, the Al wiring 5 is connected to the second transparent conducting film 11 through the aperture 10.

Finally, as shown in FIG. 1(e), a resist pattern 12 is formed on the second transparent conducting film 11 and the second transparent conducting film 11 is etched by the $FeCl_3$ aqueous solution with the resist pattern used as the mask. As explained above, a leadout electrode 11c is formed, completing an imaging device.

In above fabrication process, since the sample is kept at about 150° C. during formation of the first transparent conducting film 8 of the light receiving part, an interfacial reacted layer 8a is generated by reaction ITO and Si at the interface between the first transparent conducting film 8 and a-SiC film 7d, as shown in FIG. 2(a). This interfacial reacted layer 8a by reaction does not easily dissolve into the aqueous solution of $FeCl_3$. Therefore, when the etching time is set longer in order to perfectly remove the interfacial reacted layer 8a shown in FIG. 2(a), the lateral etching of the first transparent conducting film 8b, where ITO does not react with Si, proceeds as shown in FIG. 2(b), and a part A, where only the interfacial reacted layer 8a remains on the a-SiC film 7d, is generated. When this condition is observed from the direction where the light is incident, the periphery of the first transparent conducting film is partly protruded and recessed. Therefore, the protruded and recessed regions are also generated in the periphery of the a-SiC film 7d/a-Si film 7c/a-SiC film 7b by the successive etching. As a result, a leak current of the imaging device fabricated increases.

In order to avoid such phenomenon, the ITO film is formed under a lower temperature, then the ITO film may be peeled easily and light transmissivity becomes small so that it can no longer be put into the practical use.

As shown in FIG. 1(d), the phenomena conducted on the first transparent conducting film 8 are also generated even after formation of the second transparent conducting film 11 made of ITO film. Namely, as shown in FIG. 3(a), a side product layer 11a is generated by reaction of ITO and Si included in the PSG film 6 at the interface between the second transparent conducting film 11 and PSG film 6. Therefore, if it is attempted to perfectly remove the interfacial reacted layer 11a at the time of etching the second transparent conducting film 11 as shown in FIG. 1(e), only the ITO film 11b is etched in the lateral direction shown in FIG. 3(b), and consequently the etchant sometimes reaches the Al wiring 5. In this case, the Al wiring 5 may be etched because the etchant includes chlorine. As a result, a problem occurs in that quality of imaging device is deteriorated occurs.

As explained above, a method of etching the transparent conducting film, such as ITO, to be used for the imaging device, which provides an adequate etching rate and giving which produces no adverse effect on the device characteristics, has been not found yet.

SUMMARY OF THE INVENTION

It is an object of the present invention to provide a method of etching the transparent conducting film on a substrate including Si with an adequate etching rate.

It is another object of the present invention to provide a method of etching the transparent conducting film on a substrate including Si without deteriorating device characteristics.

It is a further object of the present invention to provide a method of patterning the transparent conducting film on a substrate including Si with high accuracy.

The objects of the present invention described above may be attained by conducting the etching method comprising the steps forming a transparent conducting film, such as ITO, on a substrate including Si and executing wet etching of the transparent conducting film with a halogenide etchant and then dry etching with a reactive gas including a halogen, with a resist pattern formed on the transparent conducting film used as the mask.

When a transparent conducting film, for example, idium.tin oxide film (ITO film), aluminum.zinc oxide film (AZO film), indium oxide film ($In_2O_3$ film), tin oxide film ($SnO_2$ film) or zinc oxide film (ZnO film) is grown under the temperature of 100° C. or higher, the interfacial reacted layer produced by reaction of ITO, AZO, $In_2O_3$, $SnO_2$, ZnO and Si are respectively formed at the interface between the substrate and the transparent conducting film. ITO, AZO, $In_2O_3$, $SnO_2$, ZnO films are etched at an adequate etching rate by the halogenide echant but the interfacial reacted layer does not easily dissolve by reaction into the halogenide etchant. However, since the interfacial reacted layer includes Si, it is etched at an adequate etching rate by the dry etching using the reactive gas including the halogen but ITO, AZO, $In_2O_3$, $SnO_2$, ZnO films have the property not to be dry-etched by the gas described above.

Accordingly, on the occasion of etching the transparent conducting film formed on the substrate including Si, the adequate etching rate may be maintained by conducting such etching process consisting of two steps i.e. the upper layer part of transparent conducting film (the region where the interfacial reacted layer by reaction with Si is not formed) is wet-etched by the halogenide etchant and thereafter the interfacial reacted layer is dry-etched with the reactive gas including halogen element. Therefore, amount of side etching of the transparent conducting film of the upper layer may be remarkably reduced.

As a result, the patterning of the transparent conducting film can be made with high accuracy by matching with the size of the pattern of etching resistant film, for example, a resist pattern. Simultaneously, increase of leak current due to irregular etching in the periphery of the light receiving region can be prevented and deterioration of characteristics based on the etching of the electrode can also be prevented.

BRIEF DESCRIPTION OF THE DRAWINGS

FIG. 1(d) is a schematic sectional view of a sample where the a-SiC film/a-Si film/a-SiC film is etched by nitrogen trifluoride ($NF_3$); the PSG film on the Al wiring is selectively etched to form apertures; and thereby the second transparent conducting film is formed at the surface;

FIG. 1(e) is a schematic sectional view of a sample where the second transparent conducting film is pattern-etched by the aqueous solution of $FeCl_3$;

DESCRIPTION OF THE PREFERRED EMBODIMENTS

Figure 1A:
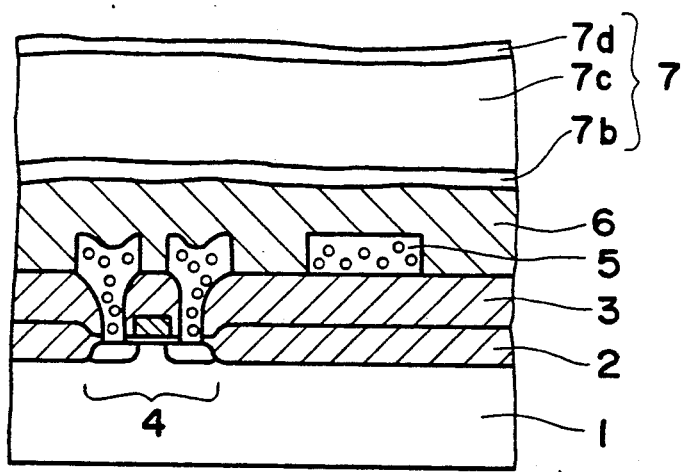
FIG. 1(a) is a schematic sectional view of a sample immediately before a transparent conducting film is formed and after a multilayered film consisting of a-SiC film/a-Si film/a-SiC film is formed as the light receiving part.
Figure 1B:
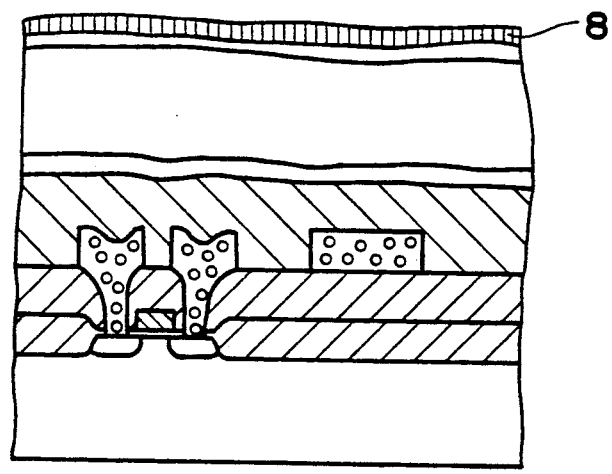
FIG. 1(b) is a schematic sectional view of a sample where a first transparent conducting film consisting of ITO is formed on the a-SiC film.
Figure 1C:
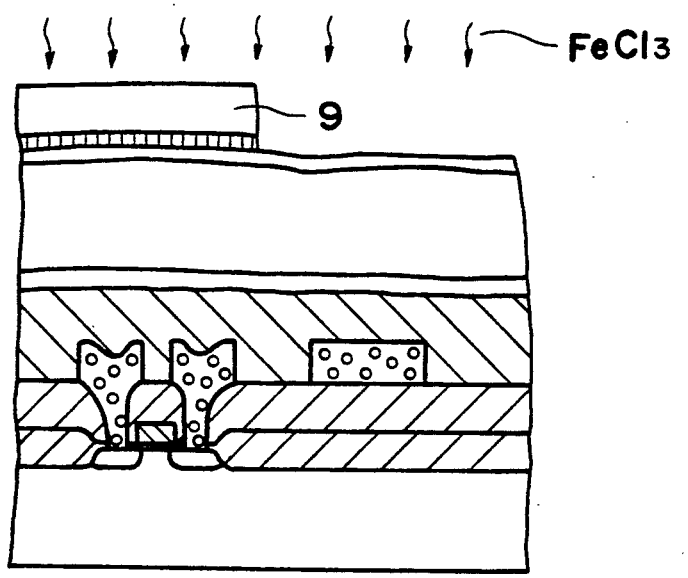
FIG. 1(c) is a schematic sectional view of a sample where the first transparent conducting film is pattern-etched by the aqueous solution of ferric chloride ($FeCl_3$)
Figure 2A:
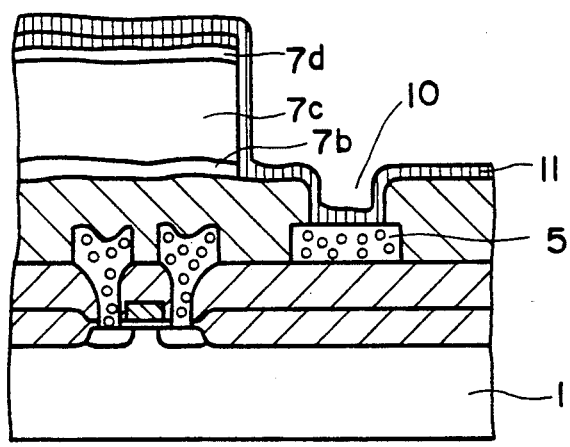
FIG. 2(a) is a schematic sectional view of a sample where an interfacial reacted layer is formed at the interface between the first transparent conducting film and the a-SiC film.
Figure 2A:
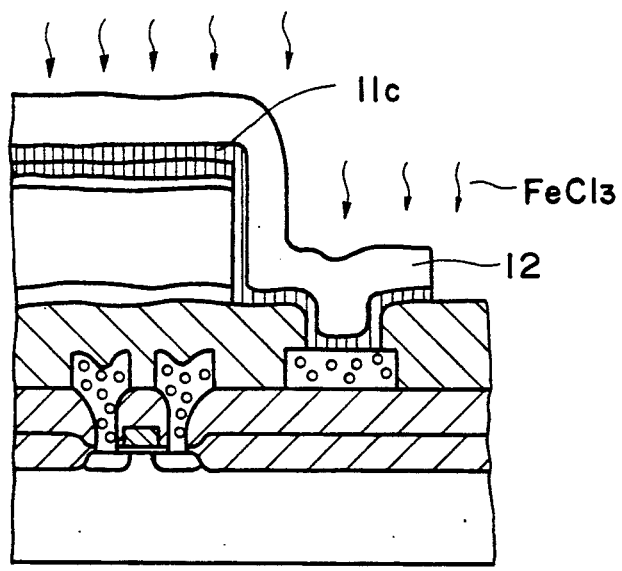
Figure 2A:
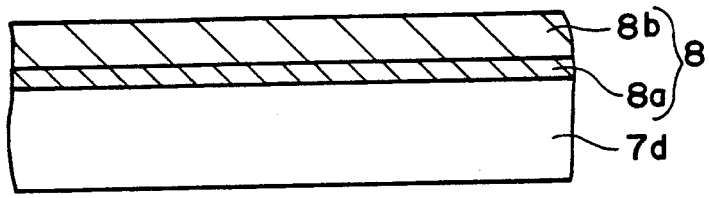
Figure 2B:
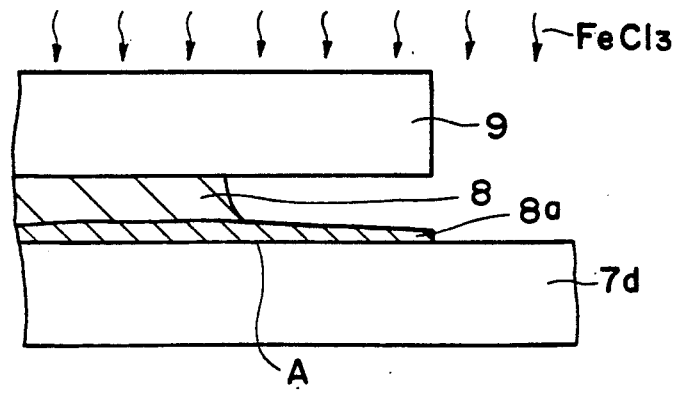
FIG. 2(b) is a schematic sectional view of a sample where the lateral etching proceeds in the region wherein ITO does not react with Si among the a-SiC film, and only the interfacial reacted layer remains unetched and is left on the a-SiC film.

The preferred embodiment of the present invention will be explained with reference to FIGS. 4 to 7. The like elements are denoted by the like reference numerals in above figures.

FIGS. 4(a) to 4(g) are schematic sectional views for explaining an embodiment in such a case that the etching method of the transparent conducting film of the present invention is applied to a method of fabricating an imaging device.

Figure 4A:
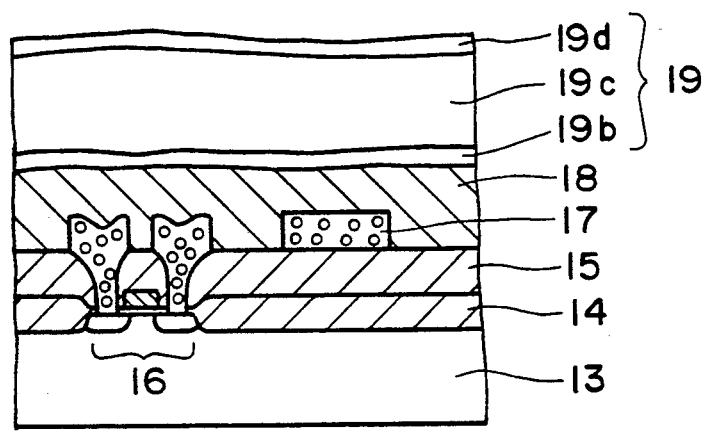
FIG. 4(a) is a schematic sectional view of a sample immediately before formation of the transparent conducting film after a multilayered film consisting of a-SiC film/a-Si film/a-SiC film is formed as the light receiving part.

FIG. 4(a) indicates the condition immediately before the transparent conducting film is formed and after a multilayered film consisting of the a-SiC film/a-Si film/a-SiC film is formed as the light receiving part.

In FIG. 4(a), the reference numeral 13 denotes a Si substrate; 14, a $SiO_2$ film for device separation; 15, an interlayer insulation film; 16, a transistor for amplification; 17, Al wiring; 18, a PSG film for flattening; 19, a light receiving region consisting of a-SiC film/a-Si film/a-SiC film. A collector electrode for charges generated through photoelectric conversion, a diode for charge storage and a CCD for charge transfer are not illustrated.

Figure 4B:
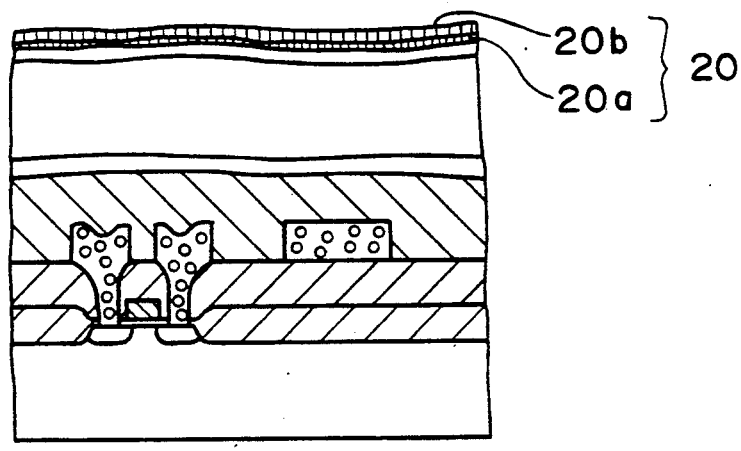
FIG. 4(b) is a schematic sectional view of a sample where the first transparent conducting film consisting of an ITO film is formed on the a-SiC film by the sputtering method.

A sample as shown in FIG. 4(b) is put into the sputtering apparatus and is kept at the temperature of about 150° C. During this period, the first transparent conducting film consisting of ITO film is formed on the a-SiC film 19d by the sputtering method. In this case, an interfacial reacted layer 20a of Si and ITO is formed at the interface between the a-SiC film 19d and the first transparent conducting film 20. A part 20b of the ITO where no interfacial reacted layer exists is left at the upper layer.

Figure 4C:
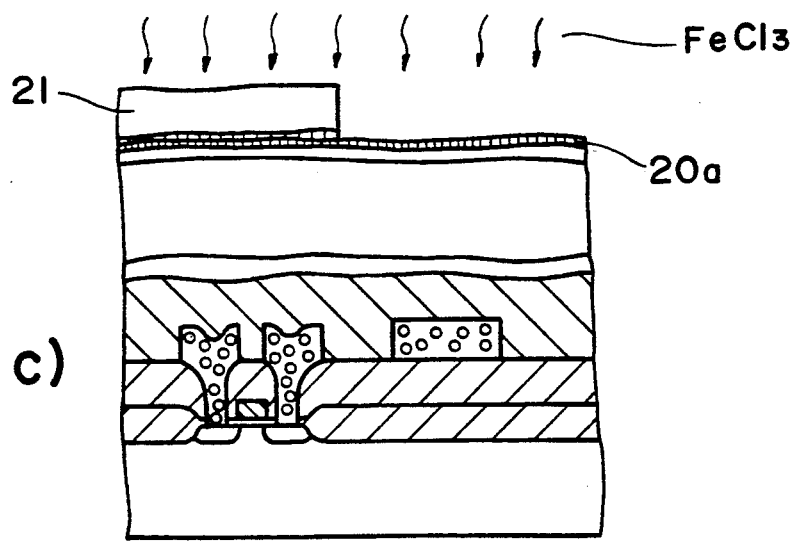
FIG. 4(c) is a schematic sectional view of a sample where the ITO film is pattern-etched by the 35% aqueous solution of ferric chloride ($FeCl_3$)

As shown in FIG. 4(c), a resist pattern 21 is formed on the ITO film 20b and the ITO film 20b is etched, first, at 30° C. to 60° C. by the aqueous solution of ferric chloride ($FeCl_3$) with this resist pattern 21 used as the mask. The most desirable temperature is 40° C. Moreover, concentration of this aqueous solution is allowed in the range from 30% to 40% but the most desirable concentration is 35%. In this case, the etching rate is 200~1000 Å/min. As the etchant, hydrochloric acid (HCl), or a mixed acid of hydrochloric acid and nitric acid ($HNO_3$), hydroiodic acid (HI) and hydrobromic acid (HBr) may also be used, in addition to the ferric chloride aqueous solution.

Figure 4D:
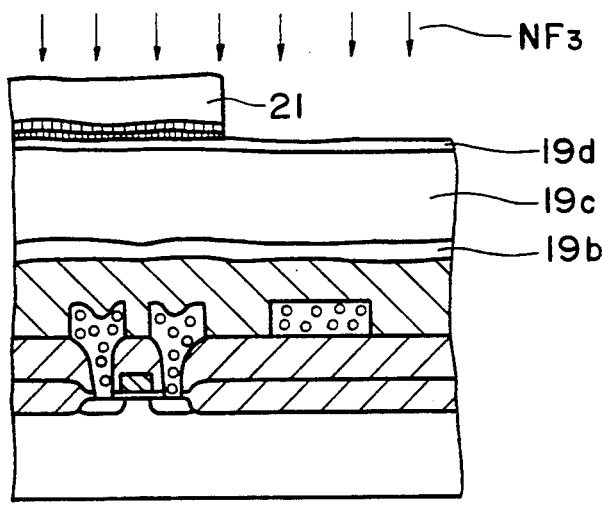
FIG. 4(d) is a schematic sectional view of a sample where a interfacial reacted layer is pattern-etched by the plasma etching method using the nitrogen trifluoride ($NF_3$)

Thereafter, as shown in FIG. 4(d), the interfacial reacted layer 20a is etched by the plasma etching method using the nitrogen trifluoride ($NF_3$) gas. The conditions of this plasma etching are as follow, for example. The $NF_3$ of 150 SCCM is supplied to the plasma etching chamber and the pressure is kept at 0.3 to 1.0 Torr but the most desirable pressure is 0.6 Torr. The sample is kept at 60° C. The plasma generating frequency is 13.56 MHz and the power is ranged from 0.05 $W/cm^2$ to 0.3 $W/cm^2$. Under these conditions, the etching rate for a-Si is set at 2000 Å/min.

Figure 5A:
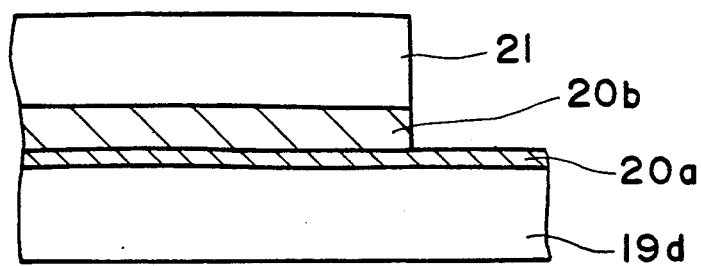
FIG. 5(a) is a schematic sectional view of a sample where the ITO layer is etched by the 35% aqueous solution of ferric chloride ($FeCl_3$) and a interfacial reacted layer remains almost unetched.
Figure 5B:
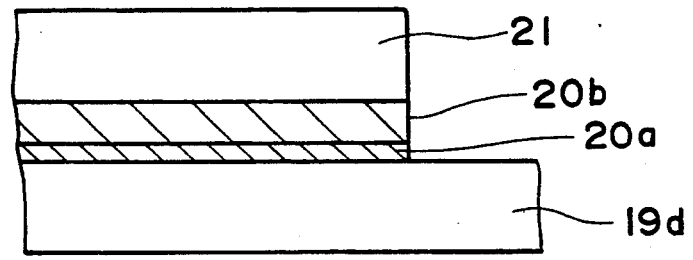
FIG. 5(b) is a schematic sectional view of a sample showing that the amount of side etching of the ITO film is remarkably less even after the interfacial reacted layer is etched by $NF_3$.

As shown in FIG. 5(a), the interfacial reacted layer 20a is almost unetched and remains after the etching by the 35% aqueous solution of the ferric chloride ($FeCl_3$) and therefore the etching process is switched to the plasma etching. The Si included in the interfacial reacted layer 20a is etched because it reacts with $NF_3$ to generate silicon tetrafluoride ($SiF_4$). Therefore this etching is carried out at the adequate etching rate. Accordingly, the side etching amount of ITO film 20b can be reduced remarkably as shown in FIG. 5(b).

Figure 4E:
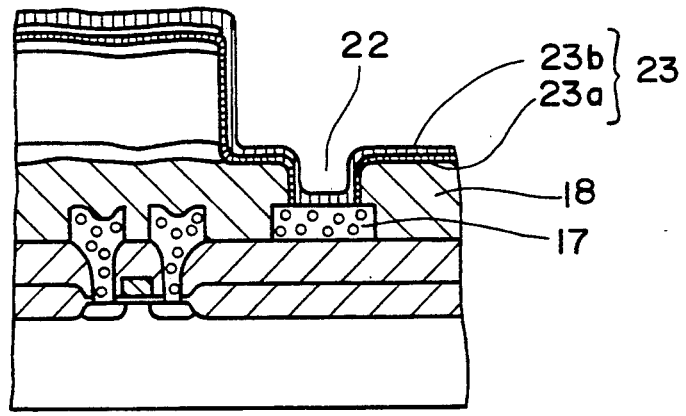
FIG. 4(e) is a schematic sectional view of a sample where the multilayered film consisting a-SiC film/a-Si film/a-SiC film is etched, the PSG film on the Al wiring is selectively etched to form an aperture, and thereafter the second transparent conducting film consisting of ITO film is formed by the sputtering method.

Therefore, the first transparent conducting film 20 can be patterned with high accuracy in line with the resist pattern 21. Moreover, since the light receiving part 19 under the resist pattern 21 is always covered with the ITO film 20b, deterioration of hetero junction at the light receiving part can be prevented. Thereafter, as shown in FIG. 4(e), the a-SiC film 19d/a-Si film 19c/a-SiC film 19b are etched under similar conditions and the PSG film 18 on the Al wiring 17 is selectively etched to form the aperture 22. The sample is then put into the sputtering apparatus, and kept at 150° C., and the second transparent conducting film 23 consisting of ITO film is formed by the sputtering method. Thereby, the Al wiring 17 and the second transparent conducting film 23 are connected through the aperture 22. In this process, like the process of FIG. 4(b), the interfacial reacted layer 23a produced by reaction of Si included in the PSG film 18 and ITO is formed at the interface of the PSG film 18 and the second transparent conducting film 23. The ITO film 23b other than the interfacial reacted layer 23a remains on the upper layer of second transparent conducting film 23 without generating a interfacial reacted layer by reaction.

Figure 4F:
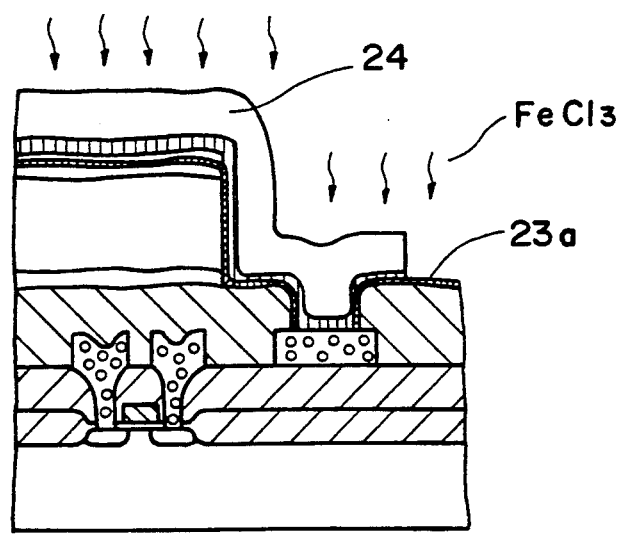
FIG. 4(f) is a schematic sectional view of a sample where the ITO film is pattern-etched by the 35% aqueous solution of ferric chloride ($FeCl_3$)
Figure 6A:
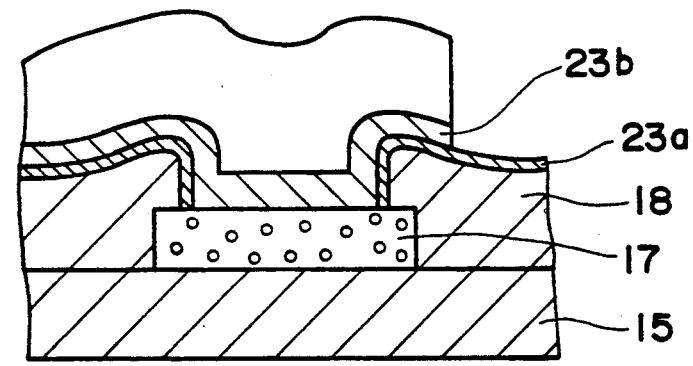
FIG. 6(a) is a schematic sectional view of a sample where the ITO film formed on the PSG film is pattern-etched by the 35% aqueous solution of ferric chloride ($FeCl_3$) and an interfacial reacted layer remains almost unetched.

Next, as shown in FIG. 4(f), after the resist pattern 24 is formed on the second transparent conducting film 23, the ITO film 23b is etched by the aqueous solution of ferric chloride ($FeCl_3$) with such resist pattern 24 used as the mask. As shown in FIG. 6(a), the interfacial reacted layer 23a is not easily etched by the aqueous solution and remains as it is.

Figure 3A:
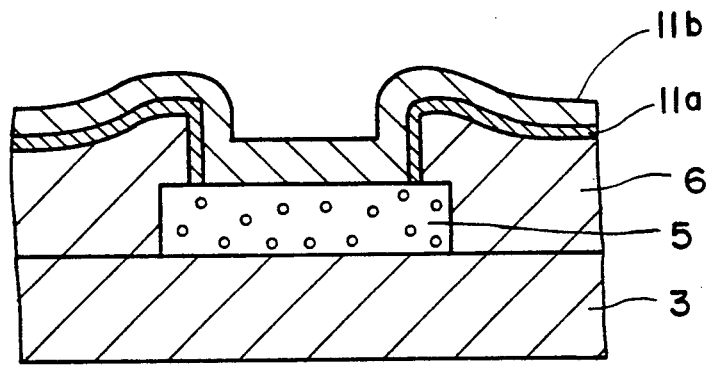
FIG. 3(a) is a schematic sectional view of a sample where interfacial reacted layer is generated at the interface between the second transparent conducting film and the PSG film.
Figure 3B:
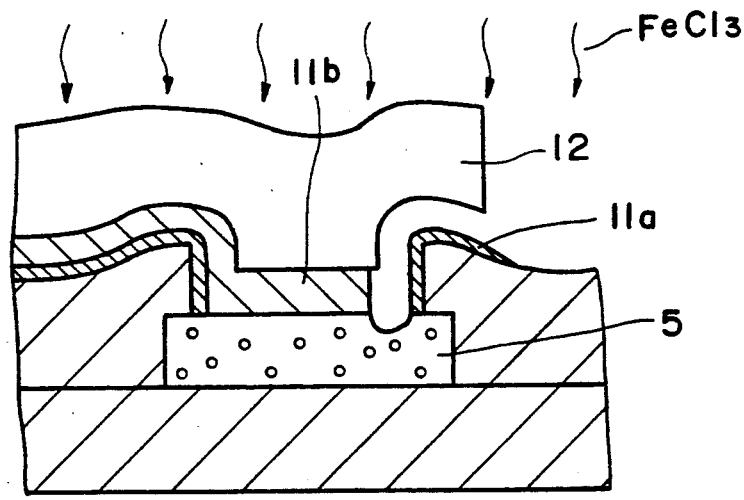
FIG. 3(b) is a schematic sectional view of a sample where only the ITO film is etched in lateral and the Al wiring is exposed.
Figure 4G:
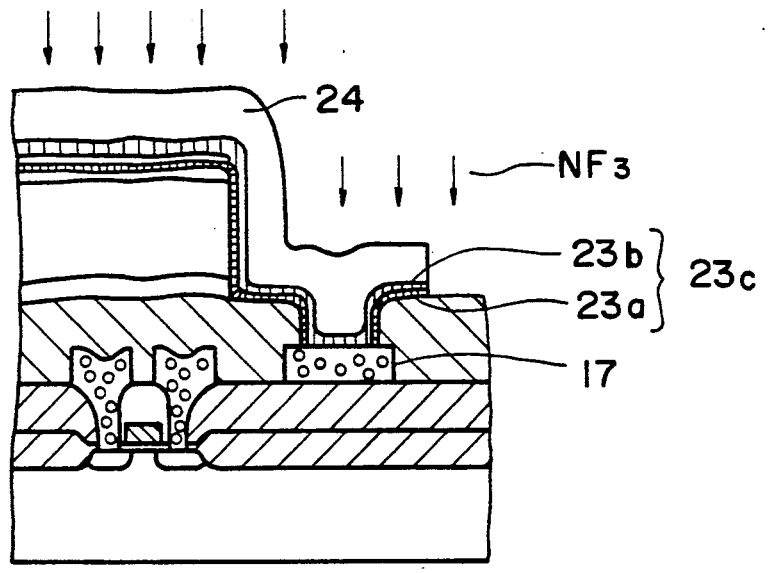
FIG. 4(g) is a schematic sectional view of a sample where an interfacial reacted layer is etched by the plasma etching method using $NF_3$ and thereby leadout electrodes are formed.
Figure 6B:
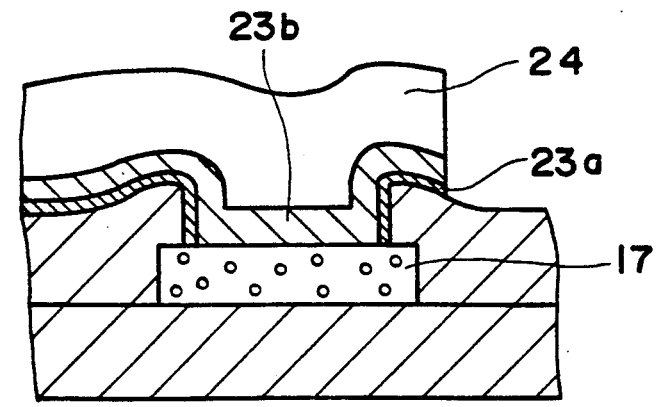
FIG. 6(b) is a schematic sectional view of a sample showing that the amount of side etching of the ITO film is remarkably less even after the interfacial reacted layers etched by $NF_3$.

Thereafter, as shown in FIG. 4(g), the interfacial reacted layer 23a is etched by the plasma etching method using $NF_3$ to form a leadout electrode 23c. Also, in this case, because the interfacial reacted layer 23a includes Si, $NF_3$ has the adequate etching rate for the interfacial reacted layer 23a. As shown in FIG. 6(b), the interfacial reacted layer 23a and ITO film 23b are patterned with high accuracy depending on the resist pattern 24, and the Al wiring 17 as the lower layer is never etched, unlike FIG. 3(b).

Finally, the resist pattern 24 is removed to complete an imaging device.

Figure 7:
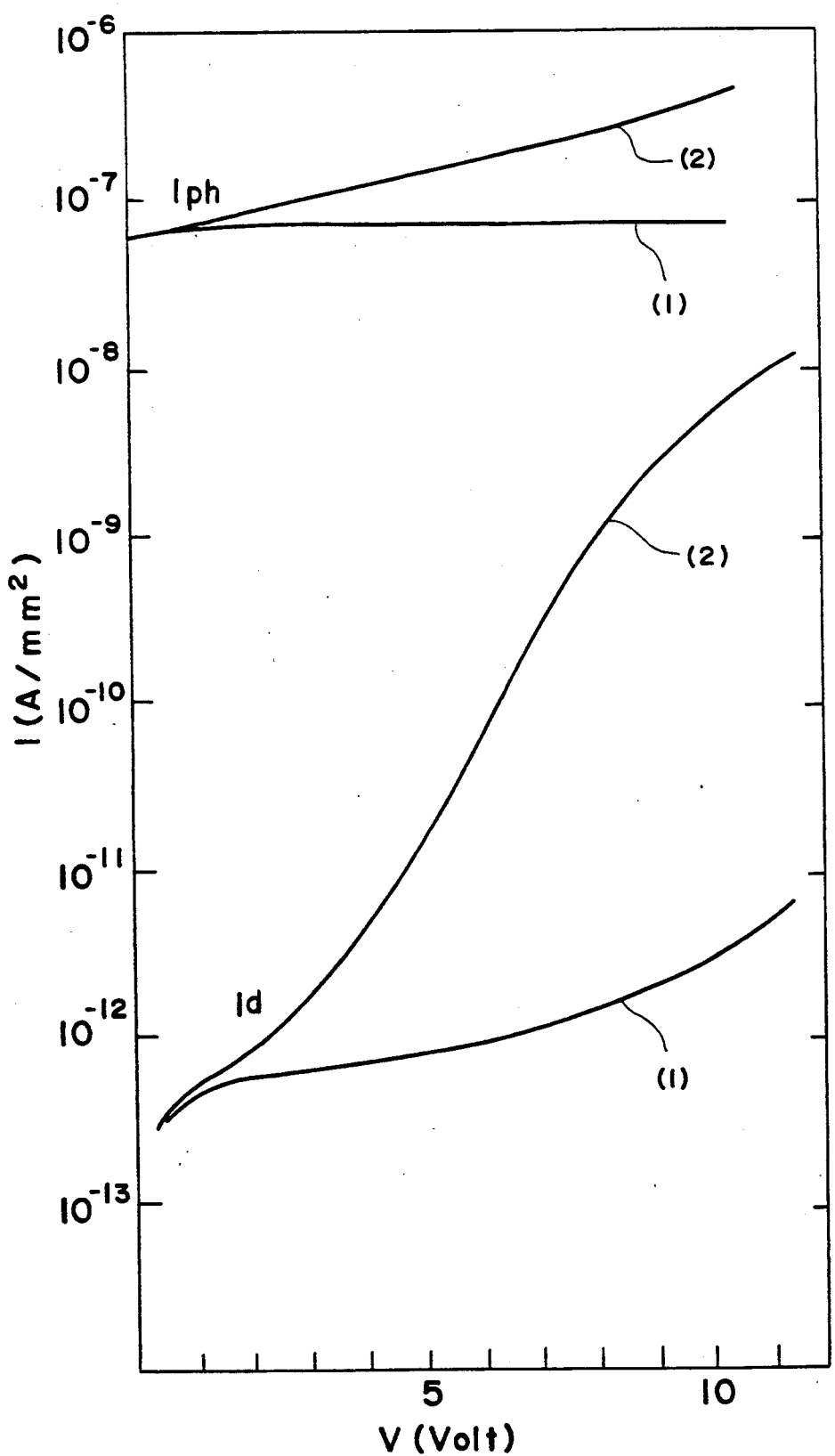
FIG. 7 is a graph indicating the current-voltage characteristics of photo current and dark current of the a-Si photodiode to which the present invention is applied.

FIG. 7 shows respective current-voltage characteristics of the photo current ($I_{Ph}$) and dark current ($I_d$) of the a-Si photo diode fabricated through application of the present invention. Also in FIG. 7, the current-voltage characteristics of the photo current ($I_{Ph}$) and dark current ($I_d$) of the a-Si photo diode fabricated through the conventional etching method are shown for the purpose of comparison. In this figure, a curve (1) is the current-voltage characteristic of the a-Si photo diode fabricated by the etching method of the present invention, while a curve (2) is the current-voltage characteristics of the same a-Si photo diode fabricated by the conventional etching method. As is obvious from this figure, ld and $l_{pN}$ of the a-Si photo diode fabricated by the etching method of the present invention show only a small change in the voltage range from 0 to 10 volts. This means that the etching method of the present invention nearly eliminates any increase of leak current.

In this embodiment, $NF_3$ has been used as the gas for plasma etching the interfacial reacted layer of ITO and Si, but following gases also provide similar effect as $NF_3$. In this case, the other conditions may be the same as that for $NF_3$ or may be slightly changed as required.

The gas for plasma etching the interfacial layer may include florine ($F_2$), nitrogen triluoride ($NF_3$), tetrafluoromethane ($CF_4$), hexafluoroethane ($C_2F_6$), octafluoropropane ($C_3H_8$), hydrogen fluoride (HF), chlorine ($Cl_2$), tetrachloromethane ($CCl_4$), hydrogen chloride (HCl), dichlorosilane ($SiH_2Cl_2$), tetrachloro-difluoroethane ($C_2F_2Cl_4$), trifluoromethane ($CHF_3$), bromine ($Br_2$), and hydrogen bromide (HBr).

What is claimed is:

1. A method of forming a patterned transparent conducting film in a fabrication of a semiconductor device, comprising the steps of:
    (a) forming a transparent conducting film on a substrate including silicon, said transparent conducting film including an interfacial reacted layer adjacent to said substrate;
    (b) patterning a resist film after forming said resist film on said transparent conducting film;
    (c) wet-etching said transparent conducting film so as to expose said interfacial reacted layer by using an etchant including a halogenide and by using the patterned resist film as a mask; and
    (d) dry-etching the exposed interfacial reacted layer by using a reactive gas including a halogen.

2. A method of forming a patterned transparent conducting film according to claim 1, wherein said transparent conducting film includes at least any one of indium oxide ($In_2O_3$), tin oxide ($SnO_2$), and zinc oxide (ZnO).

3. A method of forming a patterned transparent conducting film according to claim 1, wherein said substrate is formed by any one of silicon (Si), siliconcarbide (SiC), silicon-germanium (SiGe), spin on glass (SOG), phosphosilicate glass (PSG), silicon dioxide ($SiO_2$), boro-phosphosilicate glass (BPSG).

4. A method of forming a patterned transparent conducting film according to claim 1, wherein said etchant is any one of an aqueous solution of ferric chloride ($FeCl_3$), hydrochloric acid (HCl), hydroiodic acid (HI), hydrobromic acid (HBr), and a mixed acid of hydrochloric acid and nitric acid.

5. A method of forming a patterned transparent conducting film according to claim 4, wherein said etchant is a 30 to 40% aqueous solution of ferric chloride ($FeCl_3$) and wherein step (c) is carried out at the temperature of 30° to 60° C.

6. A method of forming a patterned transparent conducting film according to claim 1, wherein said reactive gas is any one of fluorine ($F_2$), nitrogen trifluoride ($NF_3$), tetrafluoromethane ($CF_4$), hexafluoroethane ($C_2F_6$), octafluoropropane ($C_3H_8$), hydrogen fluoride (HF), chlorine ($Cl_2$), tetrachloromethane ($CCl_4$), hydrogen chloride (HCl), diclorosilane ($SiH_2Cl_2$), tetrachloro-difluoroethane ($C_2F_2Cl_4$), trifluoromethane ($CHF_3$), bromine ($Br_2$), hydrogen bromide (HBr).

7. A method of forming a patterned transparent conducting film according to claim 6, wherein said reactive gas is nitrogen triluroide ($NF_3$) and wherein step (d) is carried out by a plasma etching method under the conditions that pressure is 0.3 to 1.0 Torr and frequency power is 0.05 to 0.3 W/cm$^2$.

8. A method of forming a patterned transparent conducting film according to claim 1, wherein said etchant is a 30 to 40% aqueous solution of ferric chloride ($FeCl_2$) and wherein step (c) is carried out at the temperature of 30° to 60° C.

9. A method of forming a patterned transparent conducting film according to claim 1, wherein said reactive gas is nitrogen trifluoride ($NF_3$) and wherein step (d) is carried out by a plasma etching method under the conditions that pressure is 0.3 to 1.0 Torr and frequency power is 0.05 to 0.3 W/cm$^2$.

10. A method of forming a patterned transparent conducting film according to claim 1, wherein step (a) includes the substep of:
    forming said transparent conducting film on a surface of said substrate while said substrate is being heated at a temperature of more than 100° C.

* * * * *

UNITED STATES PATENT AND TRADEMARK OFFICE
CERTIFICATE OF CORRECTION

PATENT NO. : 5,094,978
DATED : March 10, 1992
INVENTOR(S) : Shinji Miyagaki, et. al.

It is certified that error appears in the above-indentified patent and that said Letters Patent is hereby corrected as shown below:

Column 1, line 14, "of them are" should be deleted;
          line 27, "The" should be --(The--;
          line 36, "FIGURE" should be --figure--; and
          line 54, "since" should be deleted.

Column 2, line 50, "that" should be --that the--;
          line 51, "occurs" should be deleted; and Column 6, line 67, "Therefore this" should be --Therefore, this--;
          line 59, "ld and $1_{pN}$" should be --$I_d$ and $I_{ph}$--.

Signed and Sealed this

Twenty-eighth Day of September, 1993

Attest:

BRUCE LEHMAN

Attesting Officer      Commissioner of Patents and Trademarks